(12) United States Patent
Weingarten

(10) Patent No.: US 8,607,124 B2
(45) Date of Patent: Dec. 10, 2013

(54) SYSTEM AND METHOD FOR SETTING A FLASH MEMORY CELL READ THRESHOLD

(75) Inventor: Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 307 days.

(21) Appl. No.: 12/973,494

(22) Filed: Dec. 20, 2010

(65) Prior Publication Data

US 2011/0161775 A1    Jun. 30, 2011

Related U.S. Application Data

(60) Provisional application No. 61/290,101, filed on Dec. 24, 2009.

(51) Int. Cl.
G11C 29/00    (2006.01)

(52) U.S. Cl.
USPC ................ 714/773; 365/185.09; 365/185.24

(58) Field of Classification Search
USPC .......................... 714/773; 365/185.09, 185.24
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |

(Continued)

OTHER PUBLICATIONS

Search Report of PCT Patent Application WO 2009/118720 A3.

(Continued)

*Primary Examiner* — Philip Guyton
(74) *Attorney, Agent, or Firm* — Dentons US LLP

(57) ABSTRACT

A system, method and computer readable medium for performing a first read attempt of multiple codeword portions while using a first read threshold candidate to provide multiple first read results, wherein the multiple codeword portions are stored in multiple flash memory cells; calculating a first read threshold candidate error correction decoding based score; wherein the calculating comprises error correction decoding of the multiple first read results; performing a second read attempt of the multiple codeword portions while using a second read threshold candidate to provide multiple second read results; calculating a second read threshold candidate error correction decoding based score; wherein the calculating comprises error correction decoding of the multiple second read results; and selecting a first read threshold out of the first and second read threshold candidates based on a relationship between the first and second read threshold candidate error correction decoding based scores.

25 Claims, 12 Drawing Sheets

(56) References Cited

U.S. PATENT DOCUMENTS

| | | |
|---|---|---|
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,450,425 B2 * | 11/2008 | Aritome ............... 365/185.19 |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,613,043 B2 * | 11/2009 | Cornwell et al. ........ 365/185.18 |
| 7,697,326 B2 | 4/2010 | Sommer et al. |
| 7,706,182 B2 | 4/2010 | Shalvi et al. |
| 7,716,538 B2 * | 5/2010 | Gonzalez et al. ............. 714/709 |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 * | 3/2011 | Eun et al. ................ 365/185.18 |
| 7,961,797 B1 | 6/2011 | Yang et al. |
| 7,975,192 B2 * | 7/2011 | Sommer et al. ............... 714/719 |
| 8,020,073 B2 | 9/2011 | Emma et al. |
| 8,122,328 B2 | 2/2012 | Liu et al. |
| 8,159,881 B2 * | 4/2012 | Yang ................... 365/185.18 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 * | 12/2007 | Mokhlesi .................. 365/185.2 |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |

(56) References Cited

U.S. PATENT DOCUMENTS

| | | |
|---|---|---|
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, 2003.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, 1995.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR SETTING A FLASH MEMORY CELL READ THRESHOLD

CLAIM OF PRIORITY

This application claims the benefit of priority, under 35 U.S.C. §119, of U.S. Provisional Application No. 61/290,101, filed Dec. 24, 2009, and titled "A Method for Threshold Setting in Flash Devices," which is hereby incorporated by reference in its entirety.

BACKGROUND

Nonvolatile flash memories are used as storage media in various systems. A nonvolatile memory may include single level cells (SLC), where each SLC cell may be capable of storing one bit. A nonvolatile memory may include multiple level cells (MLC), where each MLC may be capable of storing multiple bits.

SLC and MLC memories may be read by comparing their threshold voltages to read thresholds. The values of these read thresholds can determine the error rates associated with reading the content of the flash memory cells.

SUMMARY

An embodiment in accordance with the invention provides a method for selecting a first read threshold. The method includes performing a first read attempt of multiple codeword portions using a first read threshold candidate to provide multiple first read results, calculating a first read threshold candidate error correction decoding based score, the calculation including error correction decoding of the multiple first read results, performing a second read attempt of the multiple codeword portions using a second read threshold candidate to provide multiple second read results, calculating a second read threshold candidate error correction decoding based score, the calculation including error correction decoding of the multiple second read results, comparing the first and the second read threshold candidate error correction decoding based scores, and selecting a first read threshold based on a result of the comparing step.

An embodiment in accordance with the invention provides a method for selecting a first read threshold. The method includes performing a first read attempt of multiple codeword portions using a first read threshold candidate to provide multiple first read results, performing a second read attempt of the multiple codeword portions using a second read threshold candidate to provide multiple second read results, calculating a first read threshold candidate distribution-based score and a second read threshold distribution-based score based on a distribution of values of threshold voltages of the multiple flash memory cells, comparing the first and the second read threshold candidate error correction decoding based scores, and selecting a first read threshold based on a result of the comparing step.

An embodiment in accordance with the invention provides a method for identifying multiple read thresholds. The method includes selecting a set of read thresholds by evaluating read thresholds, the selecting including, performing a first read attempt of multiple codeword portions using a first read threshold candidate associated with a currently evaluated read threshold to provide multiple first read results, calculating a first read threshold candidate score, performing a second read attempt of the multiple codeword portions using a second read threshold candidate associated with the currently evaluated read threshold to provide multiple second read results, calculating a second read threshold candidate score, and choosing the associated read threshold with the currently evaluated read threshold out of the first and the second read threshold candidates.

An embodiment in accordance with the invention provides a device for selecting one or more read thresholds in a flash memory. The device includes a read device configured to perform one or more read attempts on one or more flash memory cells, a calculation unit configured to calculate a read threshold candidate score from the results of the one or more read attempts, and a selection unit configured to select a read threshold based on a comparison between one or more read threshold candidate scores.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
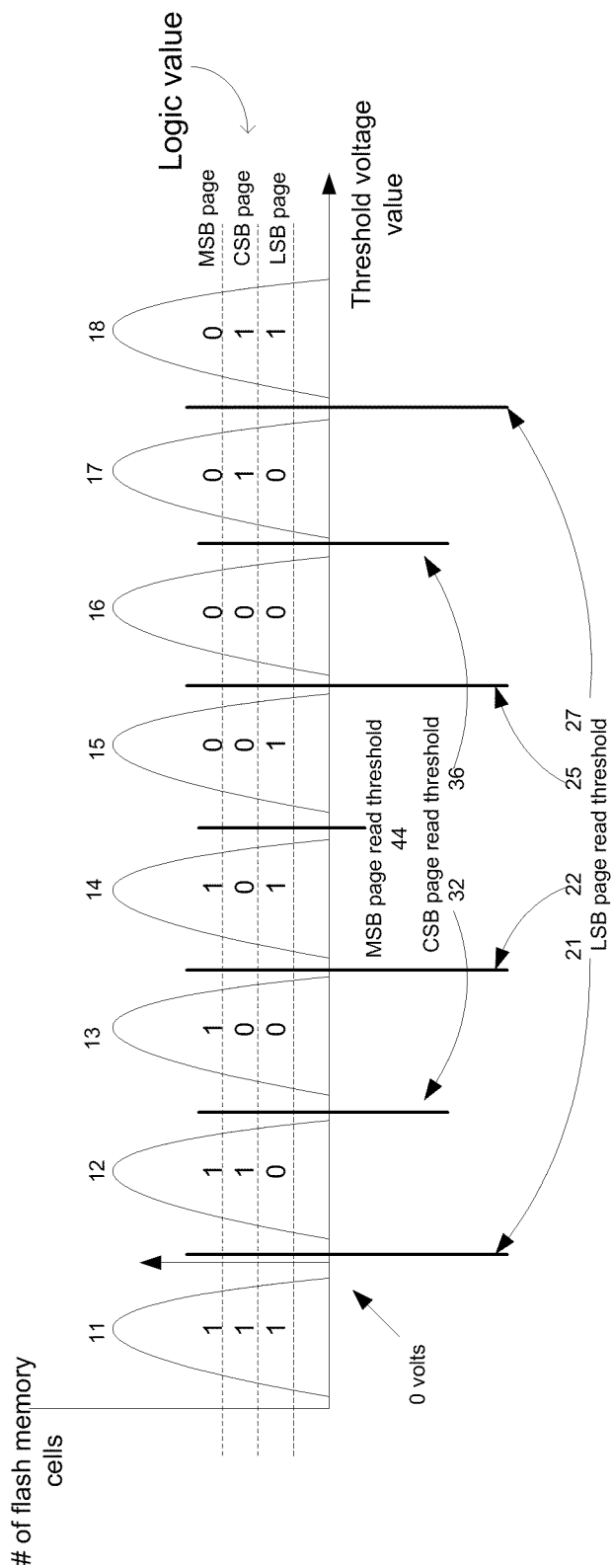
FIG. 1 illustrates an example of a 3 bit per cell (bpc) threshold voltage distribution and read thresholds in accordance with an embodiment of the invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A SLC may be read using a single read threshold. A MLC that store K bits per cell may be read by $2^K-1$ read thresholds. The most significant bit (MSB) of these K bits is read using a single MSB read threshold. The least significant bit (LSB) of these K bits is read using $2^{K-1}$ read thresholds. Central significant bits (CSB) of these K bits may be read by $2^1$ through $2^{K-2}$ CSB read thresholds—depending on the position of the CSB bit.

FIG. 1 illustrates an example of a 3 bit per cell (bpc) threshold voltage distribution and read thresholds in accordance with an embodiment of the invention. A 3 bpc cell can have a threshold voltage that may belong to one out of eight possible distribution lobes, each distribution lobe may correspond to a possible logic value out of eight possible logic values stored in the 3 bpc cell. FIG. 1 illustrates eight distribution lobes 11-18. distribution 11 is shown as a negative voltage and distribution lobes 12-17 are shown as positive voltages. The reading process includes finding the cell's threshold voltage level. Once that threshold voltage is found the logic value stored in that 3 bpc cell is revealed.

FIG. 1 also illustrates positions for read thresholds 21, 22, 25, 27, 32, 36, and 44. Read threshold 44 (shown positioned between voltage threshold lobes 14 and 15) may be a MSB read threshold. Read thresholds 32 and 36 (respectively shown positioned between voltage threshold lobes 12-13 and 16-17) may be CSB read thresholds. Read thresholds 21, 22, 25, and 27 (respectively shown positioned between voltage threshold lobes 11-12, 13-14, 15-16, and 17-18) may be LSB read thresholds.

A NAND flash memory array may include rows and columns. During a read operation one row may be read after the other. A single row may be read by supplying a threshold voltage (Vth) to the gates of the flash memory cells of that row and by supplying a bias voltage (Vbias) to all other rows. The bias voltage allows the flash memory cells to fully conduct. The flash memory cells of the row that is being read will conduct only if the threshold voltage (Vth) supplied to their gate is sufficiently high to overcome the trapped charge in their floating gate. In a MSB read operation, Vth may be set to the MSB read threshold 44. A CSB read operation may include a Vth set to a CSB read threshold 32 and (sequentially) to CSB read threshold 36. A LSB read operation may include a Vth sequentially set to each one of the four LSB read thresholds 21, 23, 25 and 27.

Figure 2:
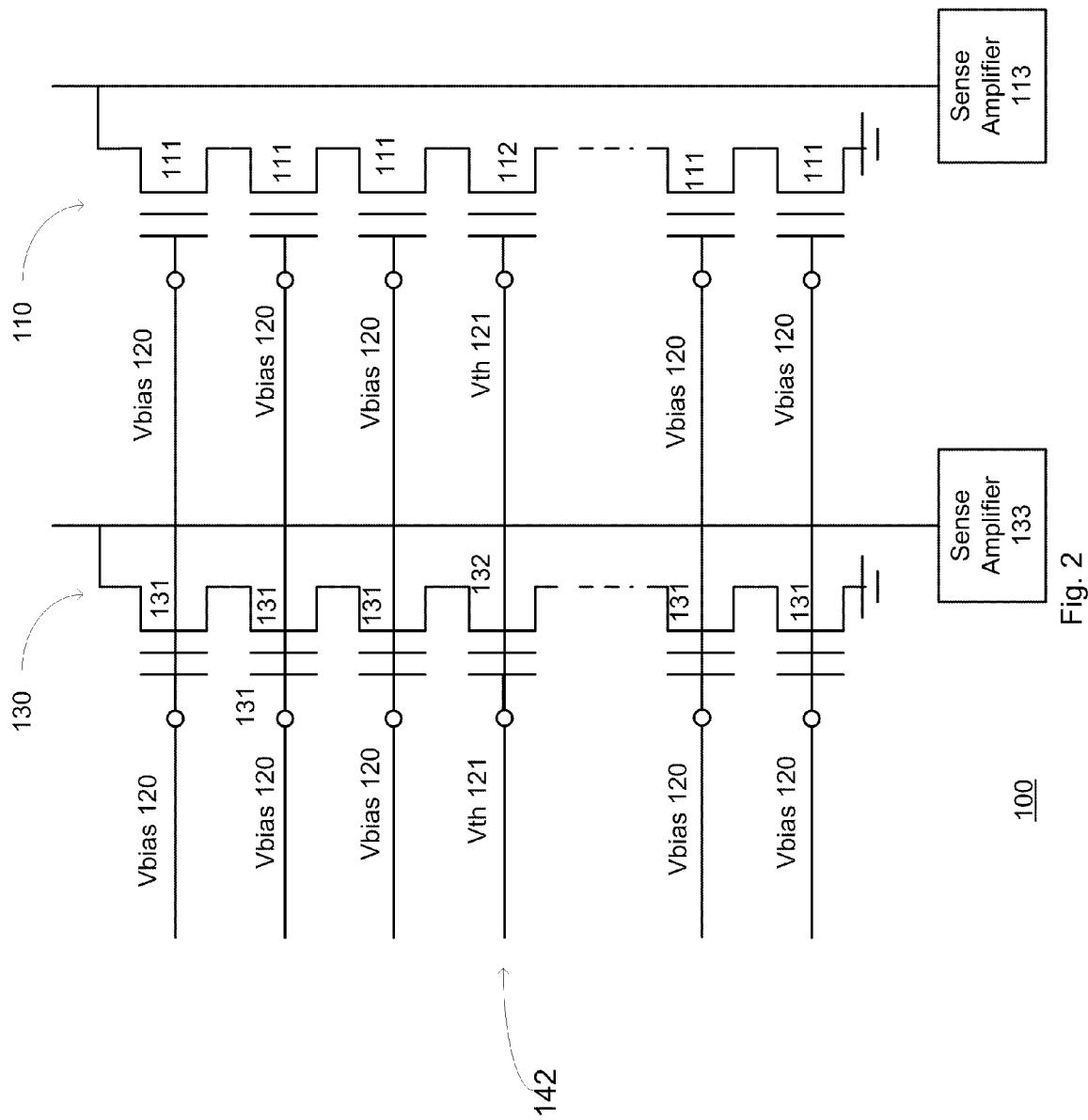
FIG. 2 illustrates a portion of a NAND flash array in accordance with an embodiment of the invention.

FIG. 2 illustrates portion 100 of a NAND flash memory array in accordance with an embodiment of the invention. Portion 100 may include column 110 connected to comparator 113, and column 130 connected to sense amplifier 133. Portion 100 also may include multiple rows having pairs of cells.

FIG. 2 illustrates the arrangement of gate threshold voltages and bias voltages supplied to the cells of portion 100 when a certain row (i.e., row 142) is being read. In the example depicted in FIG. 2, a threshold voltage, Vth 121 is supplied to the gate of cell 132 in column 130. Vth 121 may also be provided to the gate of cell 112 in column 110. As discussed above, to read row 142 a bias voltage (Vbias 120) may be supplied to all of cells 131 and 111.

Sense-amplifier 133 may sense the current flowing through column 130 to determine whether a cell in column 132 is conducting (e.g., whether cell 132 is in conduction or not). Sense-amplifier 113 may sense the current flowing through column 110 to determine whether a cell in column 110 is conducting (e.g., whether cell 112 is in conduction or not). As discussed above, the cell may conduct when a bias voltage is applied and the threshold voltage at the gate is sufficiently high to overcome the trapped charge in the cell's floating gate.

This sensing technique discussed with reference to FIG. 2 can result in errors, particularly as the threshold voltage distribution changes. The threshold voltage distribution may change as the voltage threshold lobes (illustrated in FIG. 1) may move and widen.

In accordance with an embodiment of the invention, the read thresholds may be set to reduce the errors resulting from the read operations. The read thresholds can be adjusted one or more times during the lifespan of the flash memory cells. A method in accordance with an embodiment of the invention may set the read thresholds based on one or more scores. These scores can be calculated based on error correction decoding (also referred to as score functions based on decoding results), and/or can be calculated based on a threshold voltage distribution (also referred to as score functions based on bin weights).

These scores can provide an estimation of an expected number of read errors resulting from reading flash memory cells with the read thresholds. These scores can be used to estimate one or more log likelihood ratios (LLR) for a soft decoding process that may be applied on the read content of flash memory cells.

In accordance with an embodiment of the invention, a method may choose a read threshold by relying on a success criterion, and errors corrected during the error correction decoding process. Error correcting codes may use a cyclic redundancy check (CRC) and/or other checks, or techniques, to determine whether the error correction decoding was successful or not, and the number of errors present in the data stream. The read thresholds may be modified until the entire codeword is decoded successfully. In accordance with an embodiment of the invention, the read thresholds may continue to be modified until the error correction decoding detects a minimal number of errors.

In accordance with an embodiment of the invention, the read thresholds can be determined for one or more rows of a flash memory array and be applied when reading other rows of the flash memory array.

Error Correction Decoding Based Score

A method in accordance with an embodiment of the invention may use smaller codes to obtain a score for the position of a read threshold. A total score may be obtained, for example, by summing up the smaller codes. This total score or scores may then be used to optimize the position of the read threshold. The read threshold may be set in its proper positions even if the entire codeword is not corrected by the error correction decoding.

For example, if the code is constructed from simple Hamming codes that may correct a single error, the following error correction decoding based score can be associated with each of these Hamming codes as follows:

$$\text{Score}_i = \begin{matrix} 0 & \text{(if no error was detected);} \\ 1 & \text{(if a single error was detected);} \\ 2 & \text{(if an uncorrectable codeword portion was found).} \end{matrix}$$

where i represents the corresponding Hamming code.

An uncorrectable codeword portion can be detected if, for example, the decoder suggests correcting an information unit that is outside the defined codeword—e.g., the error correction decoding is applied to an information unit that is longer than the codeword portion. As an example, consider the case where the length of the codeword can be $2^q-1$, and includes n bits of encoded information portion as well as $(2^q-1-n)$ stuffing bits. The length of the information unit complies with the error correction code that may be a Hamming code designed to correct a single error over a Glois field of $GF(2^q)$. Thus, in case of more than a single error, the decoder may suggest correcting a bit at positions higher than n. Thus, uncorrectable codeword portion can be detected with a probability of $$1 - \frac{n}{2^q - 1};$$

where "q" represents the size of the Glois finite field.

In accordance with an embodiment of the invention, an uncorrectable codeword portion can be found when an allowable range of threshold voltages is defined, and a Hamming code error is found that may be associated with a threshold voltage outside the allowable range. The values of the threshold voltages can be found by performing additional two-page reads using rough estimates of the read thresholds that delimit this allowable range. In one implementation, this method may be applied in conjunction with, or in replacement of, the method described above.

Figure 3:
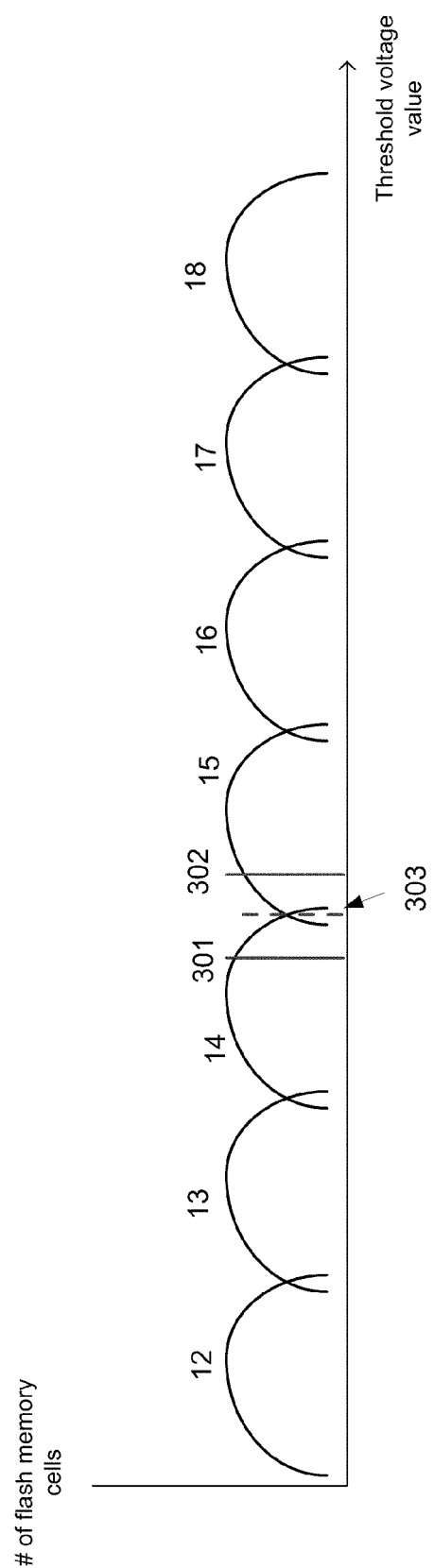
FIG. 3 illustrates a graph of read thresholds above and below an estimated optimal read threshold position in accordance with an embodiment of the invention.

FIG. 3 illustrates a graph of read thresholds above and below an estimated optimal read threshold position in accordance with an embodiment of the invention. Desired read threshold range 303 is shown delimited by read threshold values 301, 302. A determination of which flash memory cells have voltage thresholds inside, and/or outside, desired read threshold range 303 may require two read attempts that may involve comparisons to two CSB read thresholds which are set to values that correspond to read threshold values 301, 302).

The score calculation method of a portion is not necessarily limited to Hamming code encoded portions. In accordance with an embodiment of the invention, a score may be calculated for BCH (Bose, Ray-Chaudhuri, Hocquenghem) codes (a multilevel cyclic variable-length digital error-correcting code used to correct multiple random error patterns), which may correct more than a single error as well. For example, if a BCH code corrects t>1 errors, the score may be defined to be equal to the number of errors detected if the codeword is correctable, or equal to t+1 if the codeword is uncorrectable.

An uncorrectable codeword in a BCH code can be detected by checking consistency across the decoding stages. A BCH decoder may typically have a syndrome calculation, an Error Locator Polynomial (ELP) calculation, and Chien search stages. If the number of errors found during the Chien search stage is smaller than the degree of the ELP calculated during the ELP calculation stage, an uncorrectable codeword may be declared. Additionally, the length of the codeword unit can be $2^q-1$, and may include n-bits of encoded information portion as well as $(2^q-1-n)$ stuffing bits. If more errors occurred than can be corrected by the BCH code, the decoder may suggest correcting a bit at positions higher than n. Thus, an uncorrectable codeword portion can be detected.

A read threshold candidate score can be calculated based on the error correction decoding based scores of the codeword portions. The read threshold candidate score can be, for example, a sum of the error correction decoding based scores of the codeword portions, a weighted sum of these scores, and/or any other outcome of a function that takes into account at least a portion of the error correction decoding based scores of the codeword portions.

Figure 4:
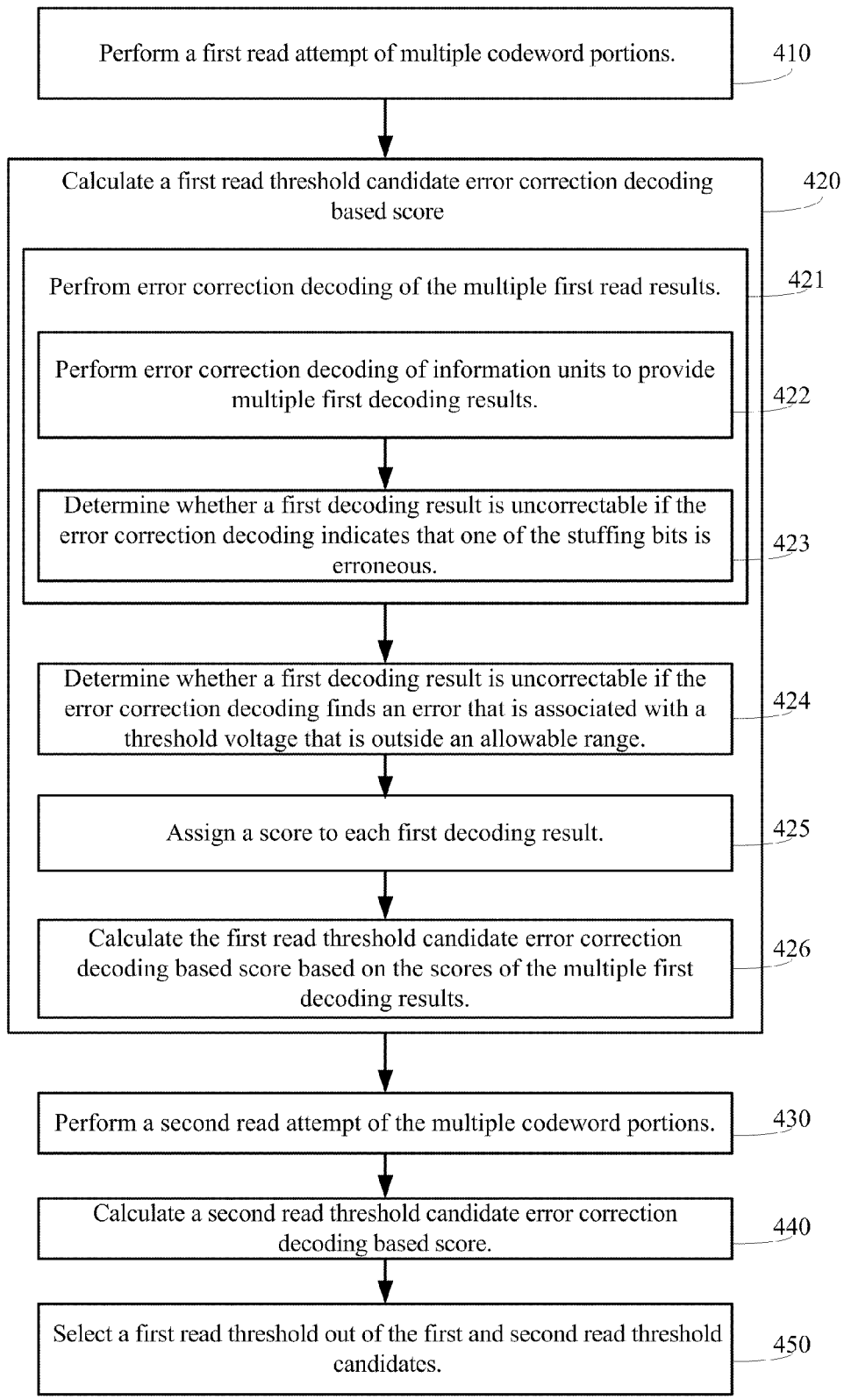
FIG. 4 illustrates a process in accordance with an embodiment of the invention.

FIG. 4 illustrates method 400 for selecting a first read threshold in accordance with an embodiment of the invention. Method 400 may start by performing a first read attempt, step 410, of multiple codeword portions, and may use a first read threshold candidate to provide multiple first read results. The multiple codeword portions may be stored in multiple flash memory cells.

A first read threshold candidate error correction decoding based score may be calculated, step 420. This calculation may include error correction decoding of the multiple first read results.

Step 420 can include one or more sub-steps including error correction decoding of the multiple first read results, step 421, to provide multiple first decoding results.

Step 421 may itself include the sub-step of error correction decoding of information units to provide multiple first decoding results, step 422—where each information unit may comprise a first read result and/or stuffing bits. Step 421 may also include the sub-step of determining whether a first decoding result is uncorrectable if the error correction decoding indicates that one of the stuffing bits is erroneous, step 423. Step 421 may include applying a Hamming error correction decoding scheme to the error correction decoding of the multiple first read results.

Step 424 may also be a sub-step of step 420. Step 424 may determine whether a first decoding result is uncorrectable if the error correction decoding finds an error that is associated with a threshold voltage that is outside an allowable range, step 424

Process 400 may continue by assigning, step 425, a score to each first decoding result. Step 425 may include assigning a score to each first decoding result, where the score is indicative of whether the error correction decoding detected an error, and/or whether a codeword portion associated with the first decoding result is uncorrectable by the error correction decoding.

A first read threshold candidate error correction decoding based score may be calculated, step 426, based on the scores of the multiple first decoding results.

At step 430, method 400 may perform a second read attempt of the multiple codeword portions and may use a second read threshold candidate to provide multiple second read results.

A second read threshold candidate error correction decoding based score may be calculated, step 440. Step 440 may include error correction decoding of the multiple second read results.

Method 400 may select a first read threshold out of the first and second read threshold candidates, step 450, based on a comparison between the first and second read threshold candidate error correction decoding based scores.

Step 450 may include selecting a candidate read threshold that has a read threshold candidate error correction decoding based score that may be indicative of fewer errors than a non-first read threshold candidate. In accordance with one embodiment of the invention, a read threshold can be selected from more than a pair or read threshold candidates.

Figure 5:
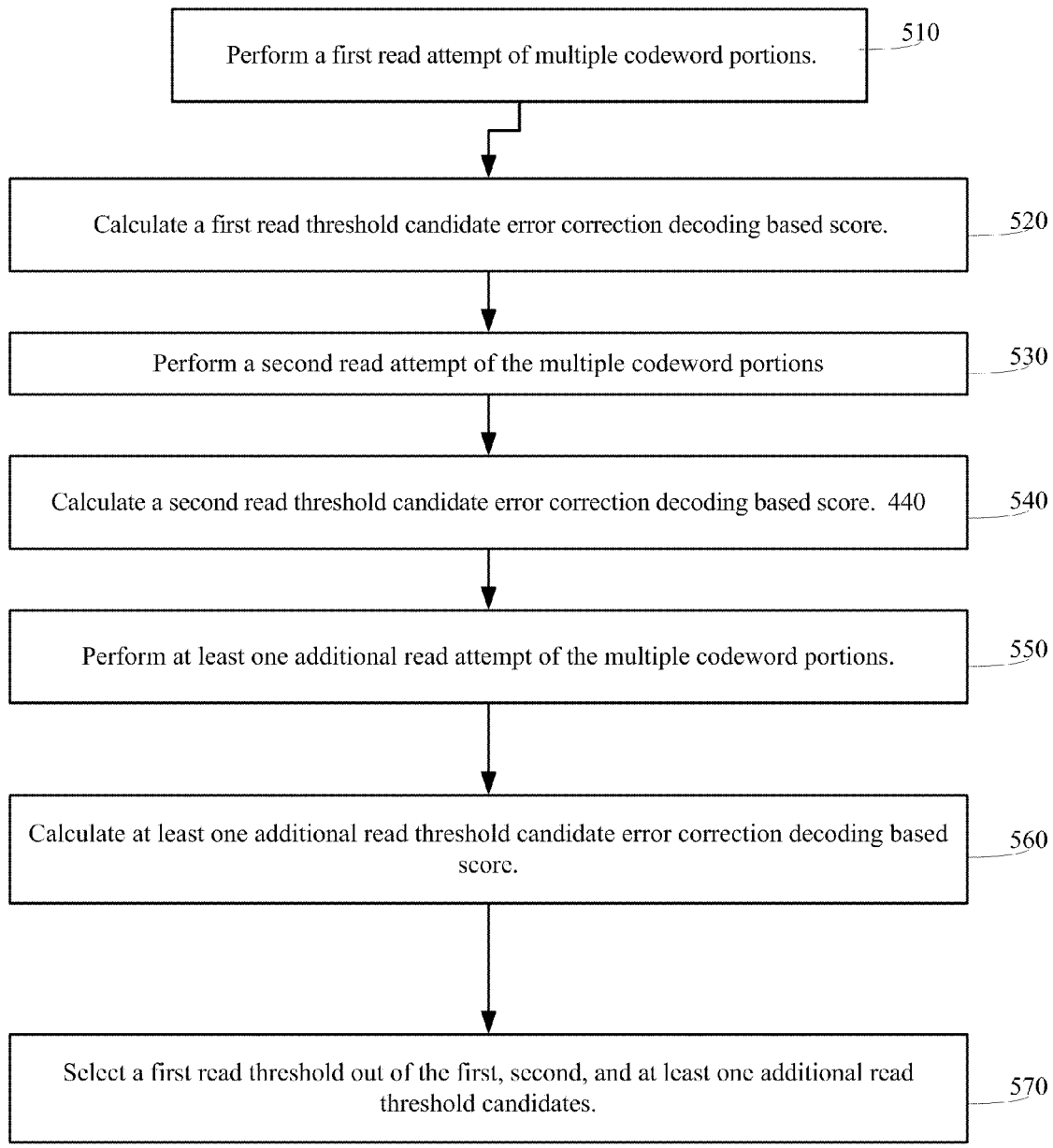
FIG. 5 illustrates a process in accordance with an embodiment of the invention.

FIG. 5 illustrates method 500 for selecting a first read threshold, in accordance with an embodiment of the invention. Method 500 may perform a first read attempt of multiple codeword portions, step 510, and may use a first read threshold candidate to provide multiple first read results. The multiple codeword portions may be stored in multiple flash memory cells.

A first read threshold candidate error correction decoding based score may be calculated, step 520. The calculation may include error correction decoding of the multiple first read results.

A second read attempt of the multiple codeword portions may be performed, step 530. This second attempt may use a second read threshold candidate to provide multiple second read results.

A second read threshold candidate error correction decoding based score may be calculated, step 540. This calculation may include error correction decoding of the multiple second read results.

At least one additional read attempt of the multiple codeword portions may be performed, step 550. This additional read attempt may use at least one additional read threshold candidate to provide multiple additional read results.

At least one additional read threshold candidate error correction decoding based score may be calculated, step 560. The calculation may include error correction decoding of the multiple additional read results.

A first read threshold out of the first, second, and at least one additional read threshold candidates may be selected, step 570. This selection may be based on a comparison between the first, second, and at least one additional read threshold candidate error correction decoding based scores.

In accordance with an embodiment of the invention, the second, third and additional read thresholds may depend on the score obtained from previous read thresholds read and score calculation operations.

Distribution Based Score

A read threshold candidate score can be based on distribution based scores of different read threshold candidates. The distribution based score may be responsive to the distribution of threshold voltages of the multiple flash memory cells. The read threshold candidate score may be calculated by using a minimum search algorithm. This search algorithm may calculate the number of cells having a threshold voltage within a bin of threshold voltages. A bin of threshold voltages may represent the voltage span between two consecutive read threshold candidates.

Figure 6:
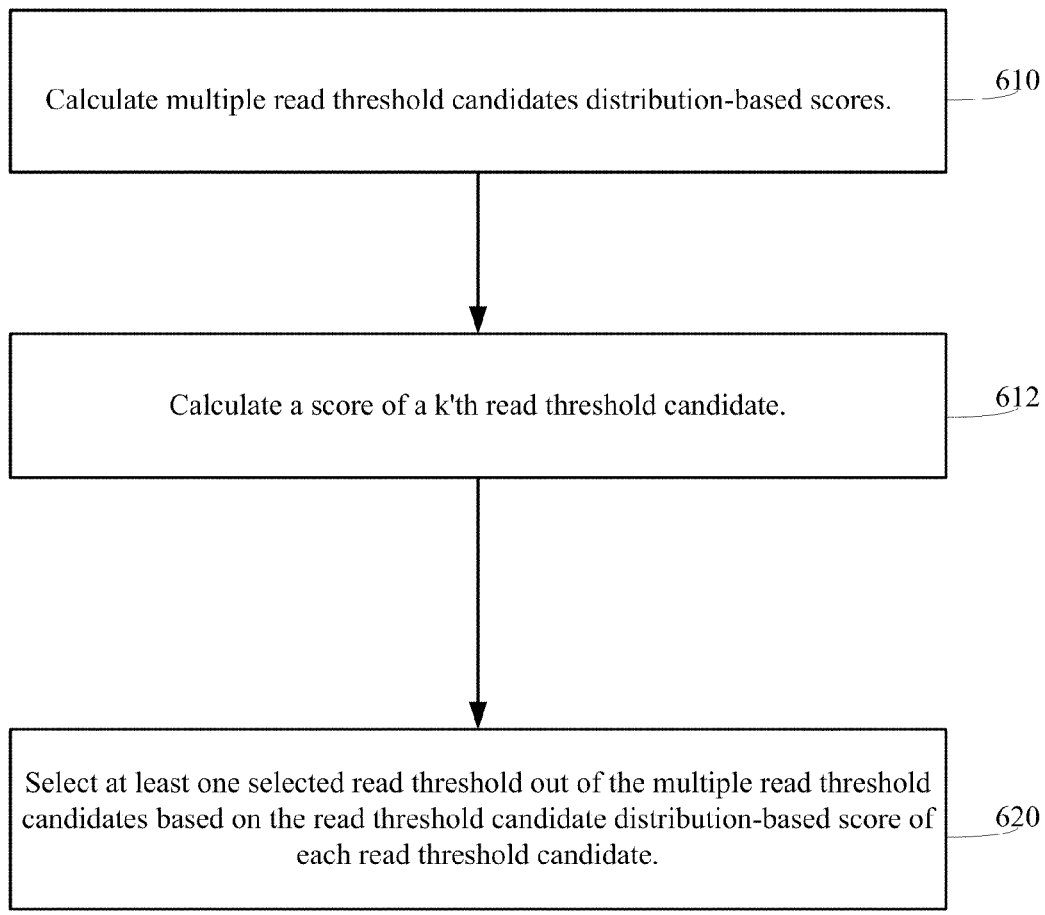
FIG. 6 illustrates a process in accordance with an embodiment of the invention.

FIG. 6 illustrates method 600 in accordance with an embodiment of the invention. Method 600 may calculate multiple read threshold candidates distribution-based scores, step 610, by counting numbers of flash memory cells that have threshold voltages that may be between each pair of read threshold candidates.

Step 610 can include calculating the multiple read threshold candidates distribution-based scores for different read threshold candidates that relate to the same read threshold and/or to different read thresholds.

Method 600 may include selecting a selected read threshold out of a group of K read threshold candidates, step 612. In accordance with an embodiment of the invention, K may be greater than three. Step 612 may include calculating a score of a k read threshold candidate (where k ranges between 2 and K−1). The score may be determined by the number of flash memory cells that have a threshold voltage within a range that starts at a (k−1) read threshold candidate and ends at a (k+1) read threshold candidate.

Method 600 may select, step 620, at least one selected read threshold out of the multiple read threshold candidates. The selection may be based on the read threshold candidate distribution-based score of each read threshold candidate. If more than a single read threshold is selected then the selection may be made between each sub-set of read threshold candidates that are associated with the same read threshold.

If at step 610 the method calculated the multiple read threshold candidates distribution-based scores for different read threshold candidates that relate to the same read threshold, at step 620 the method may select a single read threshold. If at step 610 the method calculated the multiple read threshold candidates distribution-based scores for different read threshold candidates that relate to different read thresholds, at step 620 the method may select multiple different read thresholds.

Hybrid Score

Figure 7:
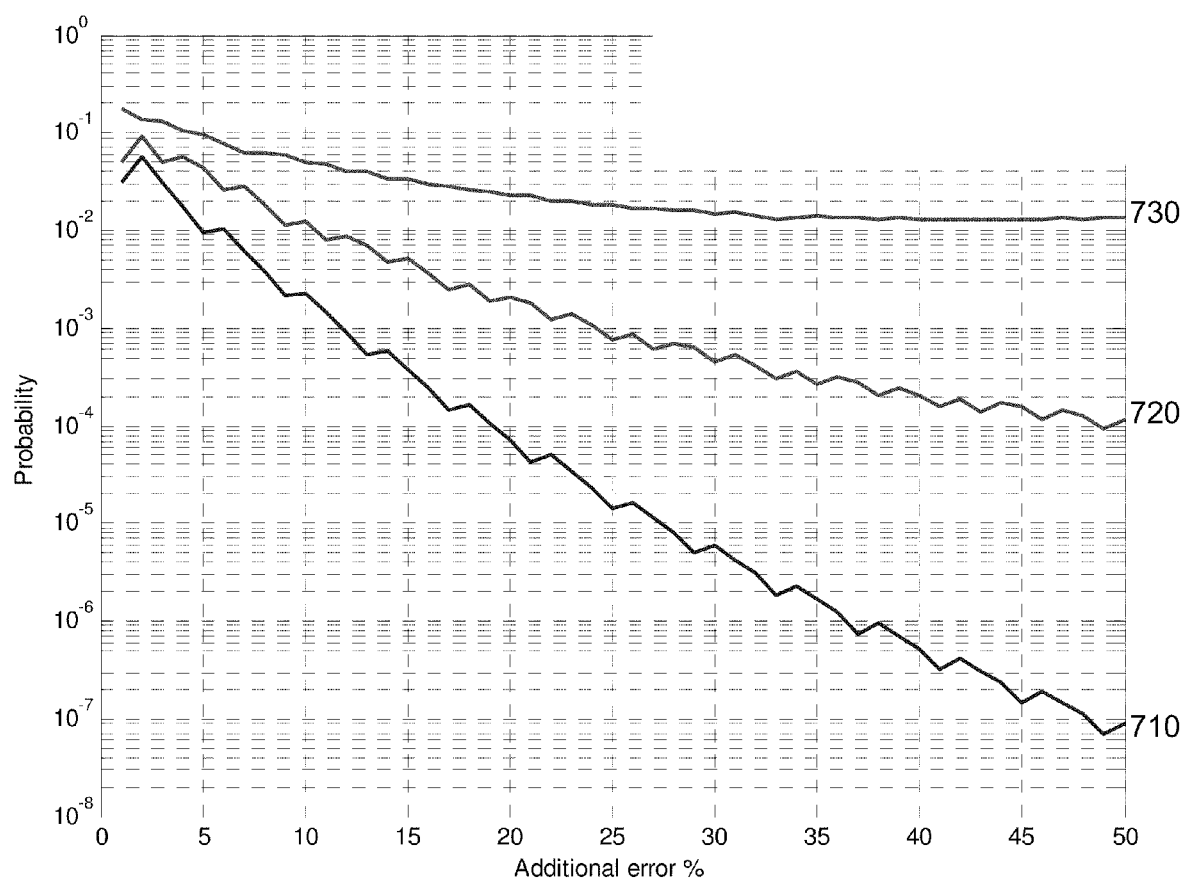
FIG. 7 illustrates a graph of a errors associated with two different read thresholds in accordance with an embodiment of the invention.

FIG. 7 illustrates a graph of errors that may be associated with two different read thresholds in accordance with an embodiment of the invention. These errors may represent the probability of choosing a non-optimal position when two read threshold candidates are considered, in accordance with an embodiment of the invention.

The first read threshold candidate may be located at an optimal read threshold position. The second read threshold candidate may be located at a position that incurs an additional error of about between 1-50 percent.

Three scenarios are illustrated in FIG. 7: (i) low curve 710 illustrates a scenario in which about 100 errors were detected; (ii) intermediate curve 720 illustrates a scenario in which about 150 errors were detected; and (iii) high curve 730 illustrates a scenario in which about 200 error were detected.

All three curves illustrate an outcome of error correction decoding that was applied on a codeword that was segmented to 89 codeword portions. The error correction decoding may involve applying a Hamming code capable of correcting a single error, assuming that more than one error may be declared as uncorrectable with 90% success rate.

FIG. 7 indicates that the accuracy of error correction decoding may be inverse to the number of errors—i.e., as the number of errors increases, the accuracy of the error correction decoding based score decreases. The accuracy of other algorithms (e.g., the distribution based score discussed above) may increase with an increase in errors.

Therefore, in accordance with an embodiment of the invention, a hybrid approach of the two scoring methods is described. Each read threshold candidate can be assigned a hybrid score that may be based on the distribution based score and the error correction decoding based score. The hybrid score may be a weighted sum of those scores, as illustrated in the following equations:

$$\text{combined score}_i = f(\text{bin } \#i-1 \text{ weight, bin } \#i+1 \text{ weight, Score}_i) = C \cdot \frac{\text{bin } \#i-1 \text{ weight} + \text{bin } \#i \text{ weight}}{2} + \text{Score}_i$$

wherein $\text{Score}_i$ may be the error correction decoding based score of the i read threshold candidate, bin #1−1 weight, may be the number of flash memory cells that have a threshold voltage that may be between the (i−1) read threshold candidate and the i read threshold candidate, and bin #1 weight may be the number of flash memory cells detected between the i read threshold candidate and the (i+1) read threshold candidate.

C may be a weight which may be chosen either analytically or empirically to optimize the choice of the read thresholds. C may be a function of $\text{Score}_i$ to account for a low number of errors $\text{Score}_i$ that may yield more accurate results than the bin weights.

Figure 8A:
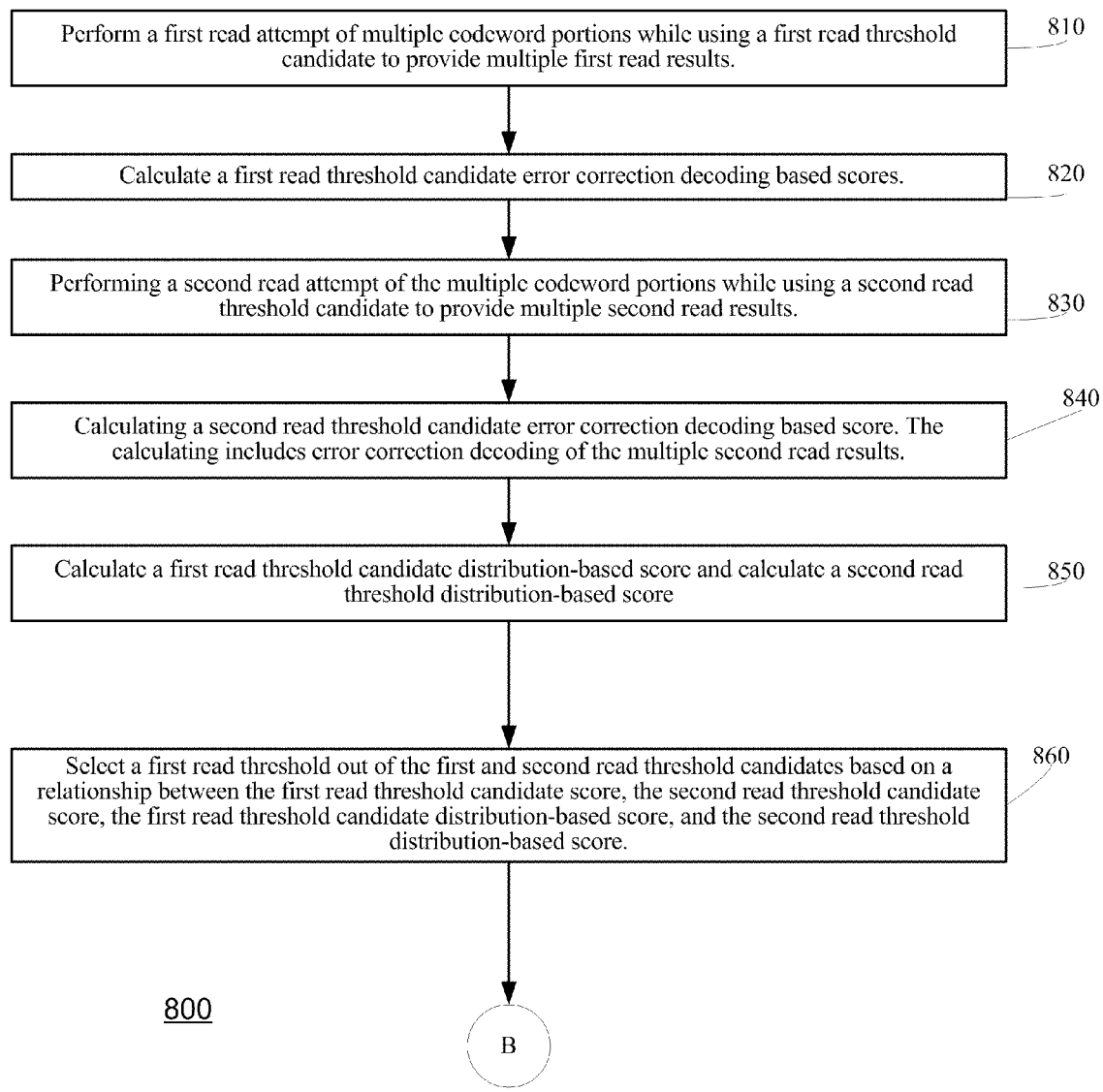
FIGS. 8A-8B illustrate a process in accordance with an embodiment of the invention.
Figure 8B:
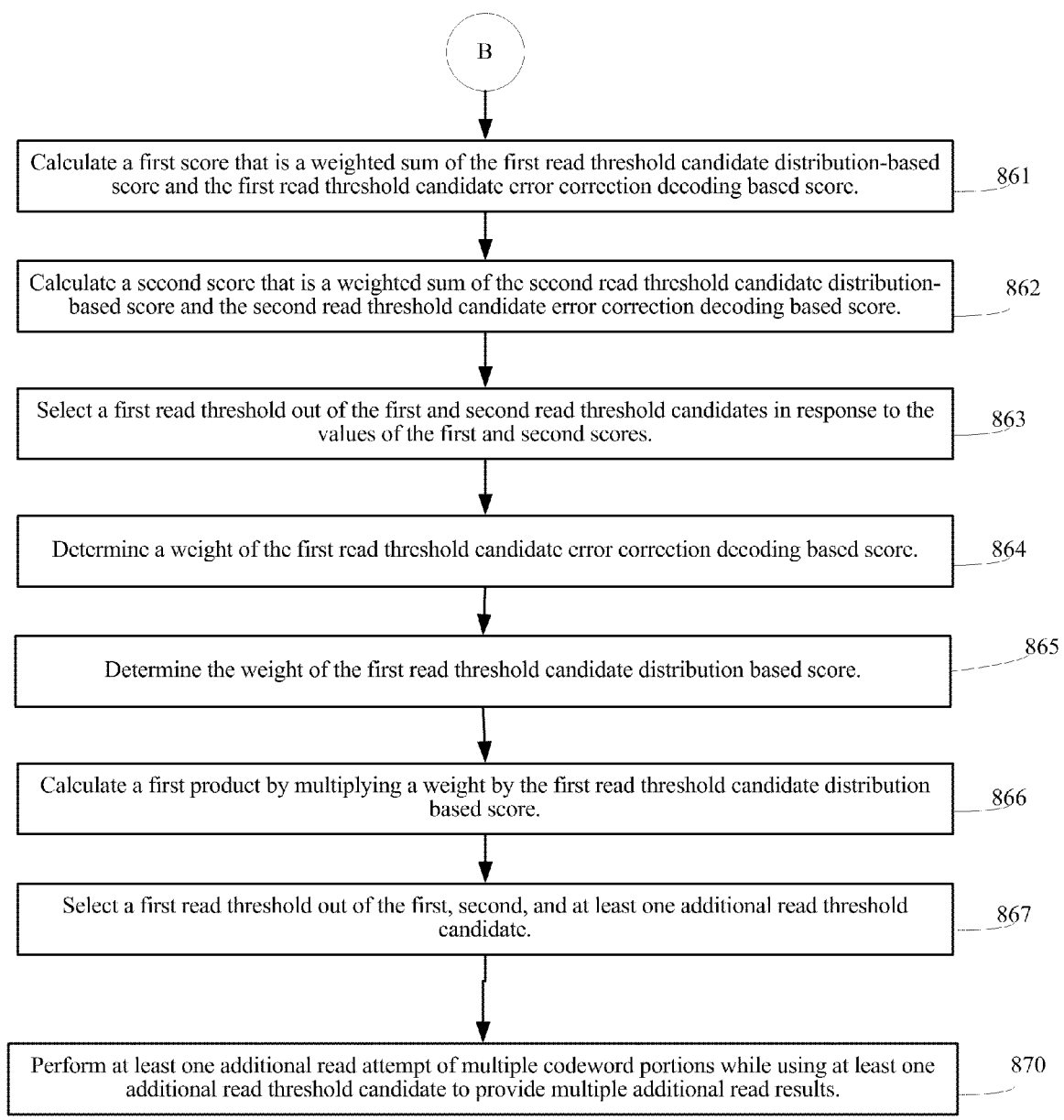

FIGS. 8A-8B illustrate method 800 for selecting a first read threshold in accordance with an embodiment of the invention. Method 800 may perform a first read attempt of multiple codeword portions, step 810, while using a first read threshold candidate to provide multiple first read results. The multiple codeword portions may be stored in multiple flash memory cells.

A first read threshold candidate error correction decoding based score may be calculated, step 820. The calculation may include error correction decoding of the multiple first read results.

A second read attempt of the multiple codeword portions may be performed, step 830. A second read threshold candidate may be used to provide multiple second read results.

A second read threshold candidate error correction decoding based score may be calculated, step 840. The calculation may include error correction decoding of the multiple second read results.

Method 800 may then calculate, step 850, a first read threshold candidate distribution-based score, and calculate a second read threshold distribution-based score. These calculations may be based on a distribution of values of threshold voltages of the multiple flash memory cells. In accordance with an embodiment of the invention, to calculate the distribution-based score for a first read threshold candidate may require selecting a third read threshold candidate which may be lower than the first read threshold candidate and performing a third read attempt of multiple codeword portions. The distribution-based score would then be the average of the value of:

A=number of cells detected to lay between the third threshold and the first threshold (e.g., this is equivalent to counting the number of bits which modified between the two read operations); and the value B=number of cells detected to lay between the first threshold and the second threshold.

In one implementation, to calculate the distribution-based score for a second read threshold candidate may similarly require selecting a fourth read threshold candidate higher than the second read threshold candidate and performing a fourth read attempt of multiple codeword portions. The distribution-based score would then be the average of the value B and C, where C=number of cells detected to lie between the second threshold and the fourth threshold.

A first read threshold may be selected, step 860, from out of the first and second read threshold candidates based on a comparison between the first read threshold candidate score, the second read threshold candidate score, the first read threshold candidate distribution-based score, and the second read threshold distribution-based score.

In accordance with an embodiment of the invention, step 860 may also include at least one of the following: (i) calculating a first score, step 861, that may be a weighted sum of the first read threshold candidate distribution-based score and the first read threshold candidate error correction decoding based score; (ii) calculating a second score, step 862, that may be a weighted sum of the second read threshold candidate distribution-based score and the second read threshold candidate error correction decoding based score; (iii) selecting a first read threshold from the first and second read threshold candidates, step 863, in response to the values of the first and second scores; (iv) determining a weight of the first read threshold candidate error correction decoding based score, step 864, based on an estimation of an amount of errors in the first codeword portions read results; (v) determining the weight of the first read threshold candidate distribution based score, step 865, based on an estimation of an amount of errors in the first codeword portions read results; (vi) calculating a first product, step 866, by multiplying a weight of the first read threshold candidate distribution-based score, where the first read threshold candidate distribution-based score may equal a number of flash memory cells that have a threshold voltage within a first range that starts at a lowest allowable read threshold voltage and ends at the second read threshold candidate; and adding the first product to the first read threshold candidate error correction decoding based score; and (vii) selecting a first read threshold, step 867, from the first, second, and at least one additional read threshold candidate in response to the first read threshold candidate error correction decoding based score, the second read threshold candidate error correction decoding based score, the at least one additional read threshold candidate error correction decoding based score, the first read threshold candidate distribution-based score, the second read threshold candidate distribution-based score, and the at least one additional read threshold candidate distribution-based score.

Method 800 may also include performing at least one additional read attempt of multiple codeword portions, step 870. The at least one additional read attempt may use at least one additional read threshold candidate to provide multiple additional read results, where the multiple codeword portions may be stored in the multiple flash memory cells. Calculating at least one additional read threshold candidate error correction decoding based score, where the calculation may include error correction decoding of the multiple additional read results; calculating at least one additional read threshold candidate distribution-based score based on a distribution of values of voltage threshold of the multiple flash memory cells.

In accordance with an embodiment of the invention, step 870 may precede step 867.

Log Likelihood Ratio Estimation:

The error correction decoding based score may be used to estimate the log likelihood ratio (LLR) of a cell which was located at a certain bin (between thresholds i and i+1). The LLR may then be used as a reference to the reliability of the logical value a certain cell obtains.

As mentioned above, the number of errors at an i read threshold candidate may also be estimated from $Score_i$. For example, for Hamming codes the average score following T errors may be approximated by:

$$\overline{Score} = N \cdot (2-f) - \left(N \cdot (2-f) + \frac{(1-f)}{1-N^{-1}}T\right) \cdot (1-N^{-1})^T;$$

where N may be the number of Hamming codes, f may be the probability that the mechanisms defined above to help detect uncorrectable codewords do not succeed, and T may be the number of errors.

By performing the inverse of the above function on the score, the number of errors may be estimated and T obtained.

Let g(Score) denote the inverse function. This inverse function may also be used to estimate the LLR for a given bin. For a bin defined by two consecutive thresholds, i and i+1, the LLR can be defined by $$LLR_i = \log\left(\frac{\text{Weight of bin } i + g(Score_{i+1}) - g(Score_i)}{\text{Weight of bin } i - g(Score_{i+1}) + g(Score_i)}\right)$$

The calculation of the LLRs may be done before performing a soft decoding procedure.

Finding Multiple Read Thresholds

In accordance with an embodiment of the invention, a read operation may involve several thresholds. For example, in LSB pages of 3 bits per cell devices, a read operation may involve four thresholds simultaneously. Optimizing the positions of the multiple read thresholds may be found in different manners. In accordance with an embodiment of the invention, a method of finding multiple read thresholds may provide an efficient method for optimizing read thresholds when a read operation uses more than a single threshold simultaneously (e.g., for LSB pages).

For example, read thresholds can be found by scanning all the possible combinations of all read thresholds candidates and selecting the best combination of read threshold candidates. Yet for another example—a less extensive search can be conduced in which the read thresholds are found by scanning only a portion of all the possible combinations of read thresholds candidates. This may involve selecting one read threshold after another.

Figure 9:
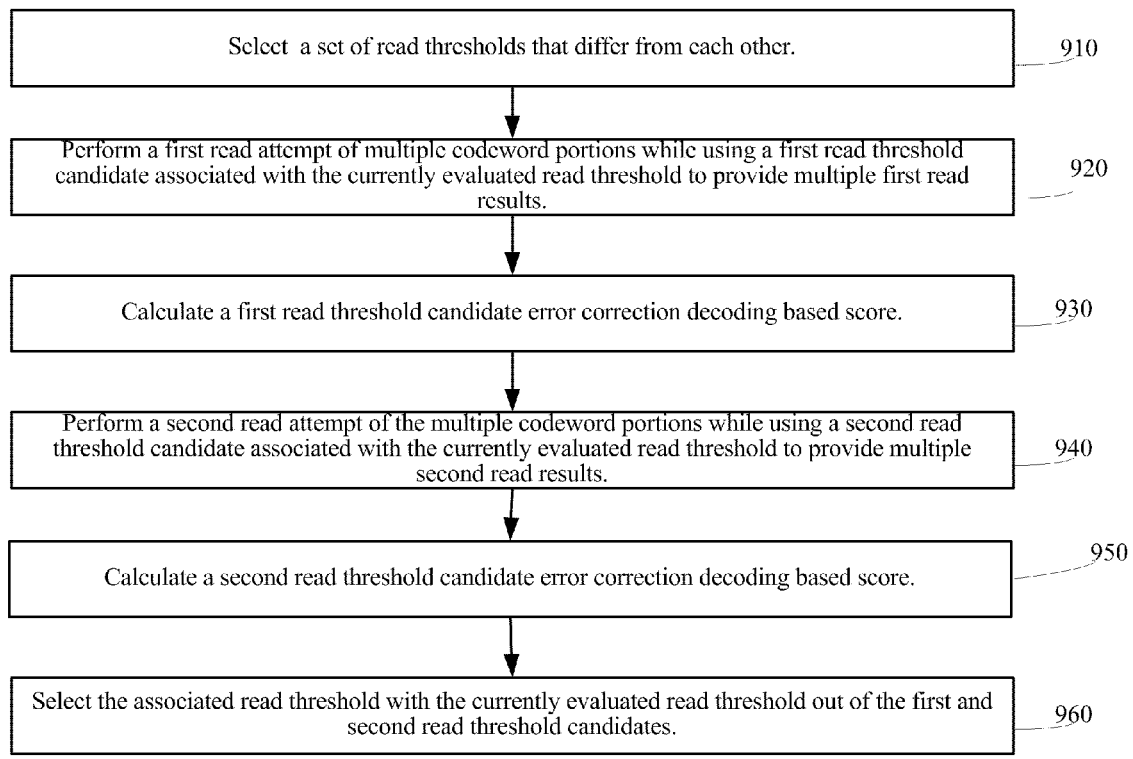
FIG. 9 illustrates a process in accordance with an embodiment of the invention.

FIG. 9 illustrates method 900 in accordance with an embodiment of the invention. Method 900 may include selecting a set of read thresholds that differ from each other, step 910. The selection of one read threshold of the set may be preceded by completion of selecting another read threshold of the set. The selection of each read threshold can be independent from the selection of another read threshold. For example, one read threshold can be selected after the selection of another read threshold ends.

The selection of each currently evaluated read threshold may include: (i) performing a first read attempt, step 920, of multiple codeword portions while using a first read threshold candidate associated with the currently evaluated read threshold to provide multiple first read results. The multiple codeword portions may be stored in multiple flash memory cells; (ii) calculating a first read threshold candidate error correction decoding based score, step 930. The calculation may include error correction decoding of the multiple first read results; (iii) performing a second read attempt of the multiple codeword portions, step 940. The second read attempt may use a second read threshold candidate associated with the currently evaluated read threshold to provide multiple second read results; (iv) calculating a second read threshold candidate error correction decoding based score, step 950. The calculation may include error correction decoding of the multiple second read results; and (v) selecting the associated read threshold with the currently evaluated read threshold, step 960. The selection may be made from the first and second read threshold candidates based on a comparison between the first and second read threshold candidate error correction decoding based scores. For both read operations, the thresholds which are not being evaluated may be set to the same value so that the difference in the read results may reflect the changes in the threshold being evaluated.

Method 900 may apply any of the previously mentioned methods for selecting the currently evaluated threshold. The set of selected read thresholds can include most significant bit read thresholds and least significant bit read thresholds.

It is noted that as more read thresholds are set and optimized, the setting of the following read thresholds may tend to be more accurate.

It is noted that after a read threshold is set or after all read thresholds are set, method 900 can re-evaluate the position of a read threshold by re-applying the above-mentioned methods to obtain a more accurate result.

It is noted that the multiple flash memory cells can be read multiple times. The results of these read attempts can be stored (in a buffer, memory, etc.). Accordingly, the buffered-read results can be used during multiple iterations of method 900.

For example, assuming that seven read threshold candidates should be checked for each read threshold out of four LSB read thresholds in a 3 bits per cell device. A single LSB read operation may use all four read results. Accordingly, the LSB page may be read seven times, where for each read operation a different threshold candidate may be used for each of the four LSB thresholds. These results can be stored in a buffer. To differentiate between bit groups that are detected using different thresholds (1 of 4), additional CSB and MSB pages reads may be performed using roughly chosen thresholds.

Figure 10:
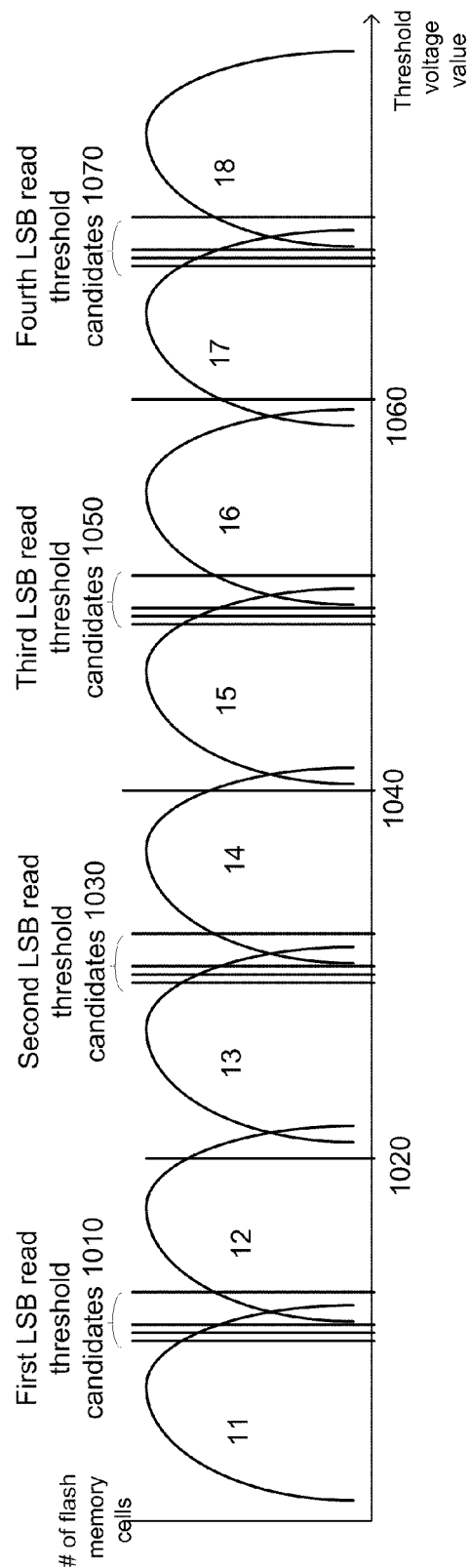
FIG. 10 illustrates buffered read thresholds in accordance with an embodiment of the invention.

FIG. 10 illustrates buffered read thresholds in accordance with an embodiment of the invention. The various read thresholds may be selected independently from each other. For example: (i) a first LSB read threshold may be selected out of first LSB read thresholds candidates 1010, (ii) independent of the selection of the first LSB read threshold, a second LSB read threshold may be selected out of second LSB read thresholds candidates 1030, (iii) independent of the selection of the first and second LSB read thresholds, a third LSB read threshold may be selected out of third LSB read thresholds candidates 1050, and (iv) independent of the selection of the first, second and third LSB read thresholds, a fourth LSB read threshold may be selected out of fourth LSB read thresholds candidates 1070. CSB read thresholds 1020 and 1060 and MSB read threshold 1040 may be selected independent of the selection of the LSB thresholds. For simplicity of explanation their read threshold candidates are not shown.

In one implementation, only nine read operations may need to be performed. Reducing the number of read operations may save considerable read time (every read operation may require time to read a flash page into the Flash device internal buffer, and then time to transfer it from the Flash internal buffer into the controller's memory). For example, the information may be stored in a memory buffer. Method 900 may be applied to the data stored in the memory buffer. It is sufficient to show that indeed nine read operations may extract all the information that may be needed. Since an LSB read operation may always compare against four thresholds, seven such LSB read operations may be performed. For the first LSB read operation, selection may be made of a first threshold to be equal to the first threshold in the set 1010. The second threshold may be chosen to be the first threshold of the set 1030. The third threshold may be chosen as the first threshold of the set 1050 and the fourth threshold may be chosen as the second threshold of the set 1070.

Similarly, the second LSB read operation may be performed while setting the four thresholds to the second threshold in the corresponding sets 1010, 1030, 1050 and 1070. All seven LSB read operations may be performed. Then another MSB read operation may be performed which may compare against threshold 1040 and a CSB read operation which may compare against thresholds 1020 and 1060. After storing page read results in a memory buffer, the CSB and MSB read results may be used to distinguish between cells which voltage thresholds lie in the region of sets 1010, 1030, 1050 or 1070. Reconstruction of an LSB read operation (from the memory buffer and without performing an actual read operation) may be done with any combination of first, second, third and fourth thresholds. This is done by taking one of the seven LSB read results, depending on with which region 1010, 1030, 1050, 1070 it is associated.

Generalization of Code-Score Metric Function

The metrics may be generalized to a general function of the decoding results of the component codes. If the component codes are more complex than Hamming codes—e.g. for BCH codes that can correct d errors a score function that may take different values can be used depending on the number of errors and if the codeword was decodable at all. In accordance with one embodiment of the invention, the score function may be expressed by:

$$score_i = \begin{cases} f_j & j \text{ errors were corrected in component } i \quad j = 0 \ldots d \\ f_{d+1} & \text{the codeword was uncorrectable} \end{cases}$$

In BCH code uncorrectable codewords may be detected if the degree of the ELP polynomial generated during the decoding stage differs from the number of error locations found during the Chien search stage.

More generally, in linear codes, the score function may be a general function of the linear equations that define the linear code—e.g., a BCH code which may be a linear code is defined by the syndrome of the codeword. The syndrome of a BCH code which may correct d error may be defined by 2d+1 equations expressed as:

$$S_k - \sum_{t=0}^{n-1} d_t \alpha^{tk}$$

$$k = 0 \ldots 2d$$

Where a $\alpha \in GF(2^q)$ is a primitive element in the Galois field $GF(2^q)$ and $d_t$ is the codeword bit t. When there are no errors the above syndrome should be 0 for all elements $S_k$. The score function may be generalized to be a general function: $f(S_0, S_1, S_2, \ldots)$. In the example above the score function is simply defined by the results of the decoding procedure.

In accordance with one embodiment of the invention, the overall score may be generalized to be any function of the component scores. The case where the overall score is the sum of all scores may be defined, but the case where it is a general function of all the component scores: score=g(score$_1$, score$_2$, score$_3$, . . . ) may be considered. For example, g(score$_1$, score$_2$, score$_3$, . . . ) may be the sum, max, min or any function of all the component scores.

In accordance with an embodiment of the invention, a score may be calculated for other component codes as well, for example, such as convolution codes, turbo codes or low density parity check (LDPC) codes, which may correct more than a single error as well. Any code which may work on portions of an entire codeword can be given a score. For example, a score may be given as a function of the number of flipped bits (e.g., score=number of flipped bits). The overall score would then be the sum of scores of the component codes.

Decoding while Optimizing Threshold Setting

In accordance with an embodiment of the invention, the threshold optimization procedure described above may obtain a set of optimal thresholds that minimize the number of errors occurring in a single read operation. However, this may still result in an overall undecodable codeword. The entire codeword is made up from the concatenation of the codewords of each of the component codes. That is, the entire codeword may be given by
Codeword=component1(Optimal THrs)||component2(Optimal THrs)||component3(Optimal THrs)|| . . . .
Where component$_i$(Optimal THrs) is the codeword of component i as obtained after sampling with the optimal thresholds as obtained from the procedure described above.

During the optimization process the readout results with nearby thresholds (close to Optimal THrs) may have been obtained. For example, read results may be obtained for different threshold candidates. For example, threshold values that are shifted by 1, 2 or 3 basic steps up or down. For each of these steps the component codes obtained different scores. Each component codeword may be chosen to use the thresholds that minimized the score of that particular component. That is the entire codeword may be constructed from the component codewords as follows:
Codeword=component1 (Optimal score1 THrs)||component2 (Optimal score2 THrs)||component3(Optimal score3 THrs)|| . . . .
Where componenti(Optimal scorei THrs) is the codeword of component i as obtained after sampling with the thresholds that optimized the score of that component.

The choice of the thresholds per component may be limited to those thresholds that are close to the overall "optimal" thresholds as obtained from the procedure above. It may be that those samples were already obtained during the optimization procedure described above and therefore it may be that no further sampling may be required.

This optimization per component technique may be used regardless of the threshold optimization procedure to further strengthen the decoding capability.

Figure 11:
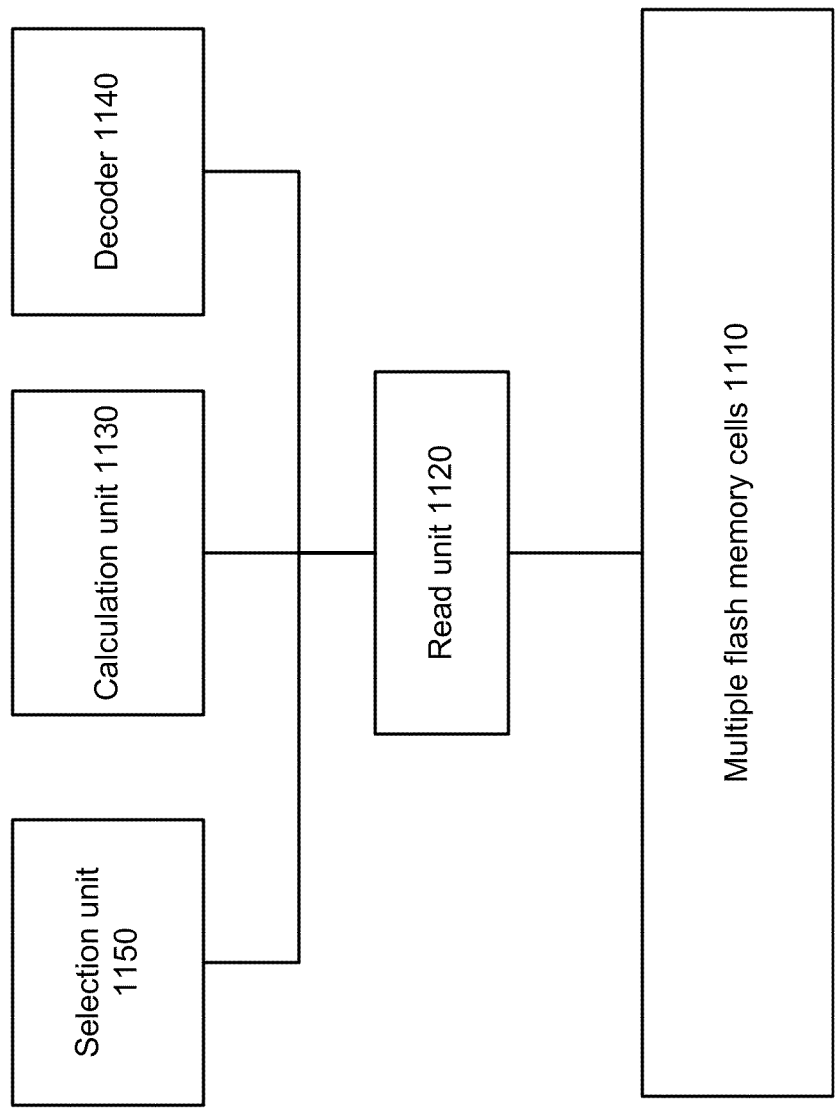
FIG. 11 illustrates a device in accordance with an embodiment of the invention.

FIG. 11 illustrates device 1100 in accordance with an embodiment of the invention. Device 1100 may include multiple flash memory cells 1110, read unit 1120, calculation unit 1130, decoder 1140, and selection unit 1150. Decoder 1140 may be configured to apply error correction decoding.

Device 1100 may execute any of methods 400, 500, 600, 800, and 900 (described above).

Read unit 1120 may be configured to perform a first read attempt of multiple codeword portions while using a first read threshold candidate to provide multiple first read results, wherein the multiple codeword portions may be stored in multiple flash memory cells 1110.

Calculation unit 1130 may be configured to calculate a first read threshold candidate error correction decoding based score; wherein the calculation may include error correction decoding of the multiple first read results.

The read unit 1120 may be further configured to perform a second read attempt of the multiple codeword portions while using a second read threshold candidate to provide multiple second read results.

Calculation unit 1130 may be further configured to calculate a second read threshold candidate error correction decoding based score; wherein the calculation may include error correction decoding of the multiple second read results.

Selection unit 1150 may be configured to select a first read threshold out of the first and second read threshold candidates based on a comparison between the first and second read threshold candidate error correction decoding based scores.

Decoder 1140 may be configured to perform error correction decoding of the multiple first read results to provide multiple first decoding results. Calculation unit 1130 may be further configured to assign a score to each first decoding result and to calculate the first read threshold candidate error correction decoding based score based on the scores of the multiple first decoding results.

Calculation unit 1130 may be configured to assign a score to each first decoding result. This score may be indicative of whether the error correction decoding detected an error, and whether a codeword portion associated with the first decoding result is uncorrectable by the error correction decoding.

Decoder 1140 may be configured to apply a Hamming error correction decoding scheme.

Selection unit 1150 may be configured to select the first read threshold that has a read threshold candidate error correction decoding based score that is indicative of fewer errors than a non-first read threshold candidate.

Decoder 1140 may be further configured to apply error correction decoding on information units to provide multiple first decoding results. Each information unit may include a first read result and stuffing bits. Decoder 1140 may also determine that a first decoding result may be uncorrectable by the error correction decoding if the error correction decoding indicates that one of the stuffing bits is erroneous.

Decoder 1140 may be further configured to apply error correction decoding of information units to provide multiple first decoding results. Each information unit may include a first read result and stuffing bits; and to determine that a first decoding result may be uncorrectable by the error correction decoding if the error correction decoding finds an error that is associated with a threshold voltage that is outside an allowable range of threshold voltages.

Read unit 1120 may be further configured to perform at least one additional read attempt of the multiple codeword portions while using at least one additional read threshold candidate to provide multiple additional read results.

Calculation unit 1130 may be configured to calculate at least one additional read threshold candidate error correction decoding based score. The calculation may include error correction decoding of the multiple additional read results.

Selection unit 1150 may be configured to select a first read threshold out of the first, second, and at least one additional read threshold candidates based on a comparison between the first, second, and at least one additional read threshold candidate error correction decoding based scores.

Calculation unit 1130 may be further configured to calculate a first read threshold candidate distribution-based score and to calculate a second read threshold distribution-based score based on a distribution of values of threshold voltages of the multiple flash memory cells.

Selection unit 1150 may be further configured to select a first read threshold out of the first and second read threshold candidates based on a comparison between the first read threshold candidate score, the second read threshold candidate score, the first read threshold candidate distribution-based score and the second read threshold distribution-based score.

Calculation unit 1130 may be further configured to calculate a first score that is a weighted sum of the first read threshold candidate distribution-based score and the first read threshold candidate error correction decoding based score, to calculate a second score that is a weighted sum of the second read threshold candidate distribution-based score and the second read threshold candidate error correction decoding based score. Selection unit 1150 may be further configured to selecting a first read threshold out of the first and second read threshold candidates in response to the values of the first and second scores.

Calculation unit 1130 may be further configured to determine a weight of the first read threshold candidate error correction decoding based score based on an estimation of an amount of errors in the first codeword portions read results.

Calculation unit 1130 may be further configured to determine the weight of the first read threshold candidate distribution based score based on an estimation of an amount of errors in the first codeword portions read results.

Calculation unit 1130 may be configured to calculate the first score by: calculating a first product by multiplying a weight by the first read threshold candidate distribution-based score, the first read threshold candidate distribution-based score equals a number of flash memory cells that have a threshold voltage within a first range that starts at a lowest allowable read threshold voltage and ends at the second read threshold candidate; and adding the first product to the first read threshold candidate error correction decoding based score.

Read unit 1120 may be further configured to perform at least one additional read attempt of multiple codeword portions while using at least one additional read threshold candidate to provide multiple additional read results, the multiple codeword portions are stored in the multiple flash memory cells.

Calculation unit 1130 may be further configured to calculate at least one additional read threshold candidate error correction decoding based score; the calculating comprises error correction decoding of the multiple additional read results.

Calculation unit 1130 may be further configured to calculate at least one additional read threshold candidate distribution-based score based on a distribution of values of voltage threshold of the multiple flash memory cells.

Selection unit 1150 may be configured to select a first read threshold out of the first, second, and at least one additional read threshold candidate in response to the first read threshold candidate error correction decoding based score, the second read threshold candidate error correction decoding based score, the at least one additional read threshold candidate error correction decoding based score, the first read threshold candidate distribution-based score, the second read threshold candidate distribution-based score, and the at least one additional read threshold candidate distribution-based score.

Selection unit 1150 may be further configured to select a set of read thresholds that differ from each other. A selection of one read threshold of the set may be preceded by a completion of a selecting of another read threshold of the set.

Device 1100 may be configured to select a currently evaluated read threshold of the set. The selection may include: performing a first read attempt of multiple codeword portions while using a first read threshold candidate associated with the currently evaluated read threshold to provide multiple first read results, the multiple codeword portions are stored in multiple flash memory cells; calculating a first read threshold candidate error correction decoding based score; the calculating comprises error correction decoding of the multiple first read results; performing a second read attempt of the multiple codeword portions while using a second read threshold candidate associated with the currently evaluated read threshold to provide multiple second read results; calculating a second read threshold candidate error correction decoding based score; the calculating comprises error correction decoding of the multiple second read results; and selecting the associated with the currently evaluated read threshold out of the first and second read threshold candidates based on a comparison between the first and second read threshold candidate error correction decoding based scores. The set of selected read thresholds may include most significant bit read thresholds and least significant bit read thresholds.

Calculation unit 1130 may be further configured to calculate a first read threshold candidate distribution-based score by counting a number of flash memory cells that have a threshold voltage that has a value that is between each pair of read threshold candidates.

Selection unit 1150 may be further configured to select a selected read threshold out of a group of K read threshold candidates, where K is greater than three.

Device 1100 may be configured to select of the selected read threshold comprises based on a score of a k read threshold candidate. Calculation unit 1130 may be configured to calculate the score of the k read threshold candidate by calculating a first product by multiplying a weight by a k read threshold candidate read threshold candidate distribution-based score, the k read threshold candidate distribution-based score equals a number of flash memory cells that have a threshold voltage within a range that starts at a (k−1) read threshold candidate and ends at a (k+1) read threshold candidate, and adding the first product to a k read threshold candidate error correction decoding based score.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device 1100 interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device 1100 interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device 1100 and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on board the flash array or otherwise incorporated there within. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly with the ECC component.

It is appreciated that software components of the present invention including programs and data may, if desired, be implemented in non-transitory ROM (read only memory) form including CD-ROMs, EPROMs and EEPROMs, or may be stored in any other suitable non-transitory computer-readable medium such as but not limited to disks of various kinds, cards of various kinds and RAMs. Components described herein as software may, alternatively, be implemented wholly or partly in hardware, if desired, using conventional techniques.

Included are machine-readable instructions for performing any or all of the steps of any of the methods shown and described herein, in any suitable order; non-transitory program storage devices readable by machine, tangibly embodying a program of instructions executable by the machine to perform any or all of the steps of any of the methods shown and described herein, in any suitable order. A computer program product may include a non-transitory computer useable medium having computer readable program code embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or clients for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable sub-combination or in a different order. "e.g." is used herein in the sense of a specific example which is not intended to be limiting.

I claim:

1. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; error-correction decoding of the multiple first read results to provide multiple first decoding results; assigning a score to each of the multiple first decoding result; and calculating the first read threshold candidate error correction decoding based score using the assigned scores of the multiple first decoding results.

2. The method of claim 1, wherein the assigned scores are indicative of whether the error correction decoding detected an error, and whether a codeword portion associated with the first decoding result is uncorrectable by the error correction decoding.

3. The method of claim 1, further including applying a Hamming error correction decoding scheme to the error-correction decoding.

4. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; error-correction decoding of information units to provide multiple first decoding results, wherein each information unit includes a first read result and one or more stuffing bits; and determining that a first decoding result is uncorrectable if the corresponding error correction decoding indicates that at least one of the stuffing bits is erroneous.

5. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; error-correction decoding of information units to provide multiple first decoding results, wherein each information unit includes a first read result and one or more stuffing bits; and determining that a first decoding result is uncorrectable if the corresponding error correction decoding indicates an error that is associated with a threshold voltage outside an allowable range of threshold voltages.

6. A method for selecting a first read threshold, the method comprising: performing a first read attempt of multiple codeword portions using a first read threshold candidate to provide multiple first read results; performing a second read attempt of the multiple codeword portions using a second read threshold candidate to provide multiple second read results; calculating a first read threshold candidate distribution-based score and a second read threshold distribution-based score based on a distribution of values of threshold voltages of the multiple flash memory cells; comparing the first and the second read threshold candidate error correction decoding based scores; and selecting a first read threshold based on a result of the comparing step; calculating a first score using a weighted sum of the first read threshold candidate distribution-based score and the first read threshold candidate error correction decoding based score; calculating a second score using a weighted sum of the second read threshold candidate distribution-based score and the second read threshold candidate error correction decoding based score; and selecting a first read threshold from the first and the second read threshold candidates using the values of the first score and the second score.

7. The method of claim 6, further including determining a weight of the first read threshold candidate error correction decoding based score using an estimation of an amount of errors in the first codeword portions read results.

8. The method of claim 7, further including determining the weight of the first read threshold candidate distribution based score using an estimation of an amount of errors in the first codeword portions read results.

9. The method of claim 6, wherein calculating of the first score includes: calculating a first product by multiplying a weight by the first read threshold candidate distribution-based score; and adding the first product to the first read threshold candidate error correction decoding based score.

10. A method for selecting a first read threshold, the method comprising: performing a first read attempt of multiple codeword portions using a first read threshold candidate to provide multiple first read results; performing a second read attempt of the multiple codeword portions using a second read threshold candidate to provide multiple second read results; calculating a first read threshold candidate distribution-based score and a second read threshold distribution-based score based on a distribution of values of threshold voltages of the multiple flash memory cells; comparing the first and the second read threshold candidate error correction decoding based scores; and selecting a first read threshold based on a result of the comparing step; performing at least one additional read attempt of multiple codeword portions stored in the multiple flash memory cells using at least one additional read threshold candidate to provide multiple additional read results; calculating at least one additional read threshold candidate error correction decoding based score, the calculation including error correction decoding of the multiple additional read results; calculating at least one additional read threshold candidate distribution-based score using a distribution of values of voltage threshold of the multiple flash memory cells; and including the at least one additional read threshold candidate error correction decoding based score and the at least one additional read threshold candidate distribution-based score in the comparing step.

11. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; selecting a set of read thresholds that differ from each other, the selecting of a currently evaluated read threshold including: performing a first read attempt of multiple codeword portions using a first read threshold candidate associated with the currently evaluated read threshold to provide multiple first read results; calculating a first read threshold candidate error correction decoding based score, the calculation including error correction decoding of the multiple first read results; performing a second read attempt of the multiple codeword portions using a second read threshold candidate associated with the currently evaluated read threshold to provide multiple second read results; calculating a second read threshold candidate error correction decoding based score, the calculation including error correction decoding of the multiple second read results.

12. The method of claim 11, wherein the set of selected read thresholds includes most significant bit read thresholds and least significant bit read thresholds.

13. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; calculating a first read threshold candidate distribution-based score by counting a number of flash memory cells that have a threshold voltage that is between each pair of read threshold candidates.

14. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; selecting a selected read threshold out of a group of k read threshold candidates, wherein k is greater than three; the selecting including calculating a score of a k read threshold candidate by: calculating a first product by multiplying a weight by a k read threshold candidate read threshold candidate distribution-based score, wherein the k read threshold candidate distribution-based score equals a number of flash memory cells that have a threshold voltage within a range that starts at a (k−1) read threshold candidate and ends at a (k+1) read threshold candidate; and adding the first product to a k read threshold candidate error correction decoding based score.

15. A non-transitory computer readable medium having stored thereon instructions which when executed by a processor cause the processor to perform the method of: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; and selecting a first read threshold based on a result of the comparing step; error-correction decoding of the multiple first read results to provide multiple first decoding results; assigning a score to each of the multiple first decoding result; and calculating the first read threshold candidate error correction decoding based score using the assigned scores of the multiple first decoding results.

16. The non-transitory computer readable medium of claim 15, wherein the assigned scores are is indicative of whether the error correction decoding detected an error, and whether a codeword portion associated with the first decoding result is uncorrectable by the error correction decoding.

17. The non-transitory computer readable medium of claim 15, further including instructions that cause the processor to perform the step of applying a Hamming error correction decoding scheme to the error-correction decoding.

18. A non-transitory computer readable medium having stored thereon instructions which when executed by a processor cause the processor to perform the method of: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; and selecting a first read threshold based on a result of the comparing step; error-correction decoding of information units to provide multiple first decoding results, wherein each information unit includes a first read result and one or more stuffing bits; and determining that a first decoding result is uncorrectable if the corresponding error correction decoding indicates that at least one of the stuffing bits is erroneous.

19. A non-transitory computer readable medium having stored thereon instructions which when executed by a processor cause the processor to perform the method of: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; and selecting a first read threshold based on a result of the comparing step; error-correction decoding of information units to provide multiple first decoding results, wherein each information unit includes a first read result and one or more stuffing bits; and determining that a first decoding result is uncorrectable if the corresponding error correction decoding indicates an error that is associated with a threshold voltage outside an allowable range of threshold voltages.

20. A non-transitory computer readable medium having stored thereon instructions which when executed by a processor cause the processor to perform the method of: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; and selecting a first read threshold based on a result of the comparing step; calculating a first read threshold candidate distribution-based score and a second read threshold distribution-based score based on a distribution of values of threshold voltages of the multiple flash memory cells; and including the first read threshold candidate distribution-based score and the second read threshold distribution-based score in the comparing step.

21. The non-transitory computer readable medium of claim 20, further including instructions that cause the processor to perform the steps of: calculating a first score using a weighted sum of the first read threshold candidate distribution-based score and the first read threshold candidate error correction decoding based score; calculating a second score using a weighted sum of the second read threshold candidate distribution-based score and the second read threshold candidate error correction decoding based score; and selecting a first read threshold from the first and the second read threshold candidates using the values of the first score and the second score.

22. The non-transitory computer readable medium of claim 21, further including instructions that cause the processor to perform the step of determining a weight of the first read threshold candidate error correction decoding based score using an estimation of an amount of errors in the first codeword portions read results.

23. A method for selecting a first read threshold, the method comprising: performing a first read attempt of multiple codeword portions using a first read threshold candidate to provide multiple first read results; calculating a first read threshold candidate error correction decoding based score, the calculation including error correction decoding of the multiple first read results; performing a second read attempt of the multiple codeword portions using a second read threshold candidate to provide multiple second read results; calculating a second read threshold candidate error correction decoding based score, the calculation including error correction decoding of the multiple second read results; comparing the first and the second read threshold candidate error correction decoding based scores; selecting a first read threshold based on a result of the comparing step; estimating a log likelihood ratio (LLR) of a cell being located between a certain threshold bin; using the estimated LLR as a reference of a reliability of a value a certain cell obtains.

24. The method of claim 23, wherein an error correction decoding based score is used as the LLR estimation.

25. The method of claim 23, wherein the LLR estimation is performed prior to applying a soft decoding procedure on the content of a flash memory cell.

* * * * *